(12) United States Patent
Streett

(10) Patent No.: US 8,232,129 B2
(45) Date of Patent: Jul. 31, 2012

(54) BONDING SOLAR CELLS DIRECTLY TO POLYIMIDE

(75) Inventor: Andrew Streett, San Clemente, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 12/970,230

(22) Filed: Dec. 16, 2010

(65) Prior Publication Data

US 2012/0156824 A1    Jun. 21, 2012

(51) Int. Cl.
*H01L 21/00* (2006.01)
(52) U.S. Cl. .............. 438/64; 438/66; 257/E31.117; 257/E31.118; 257/E31.131
(58) Field of Classification Search .......... 438/66–67; 257/E31.117, E31.118, E31.131
See application file for complete search history.

(56) References Cited

U.S. PATENT DOCUMENTS

| | | | |
|---|---|---|---|
| 3,179,630 A | 4/1965 | Endrey | |
| 3,179,634 A | 4/1965 | Edwards | |
| 4,394,529 A * | 7/1983 | Gounder | 136/245 |
| 4,542,257 A | 9/1985 | Fraser et al. | |
| 5,614,033 A | 3/1997 | Robinson et al. | |
| 6,300,158 B1 | 10/2001 | Simburger et al. | |
| 6,313,396 B1 | 11/2001 | Glenn | |
| 6,410,362 B1 | 6/2002 | Simburger et al. | |
| 2008/0214777 A1 * | 9/2008 | Poe | 528/338 |
| 2009/0188603 A1 * | 7/2009 | Haller et al. | 156/64 |
| 2009/0288699 A1 * | 11/2009 | Auman et al. | 136/249 |
| 2010/0330731 A1 * | 12/2010 | Agarwal et al. | 438/73 |

OTHER PUBLICATIONS

Campbell, D. et al., "Development of a Novel, Passively Deployed Roll-Out Solar Array," presented at teh 2006 IEEE Aerospace Conference, Big Sky, MT (Mar. 4-11, 2006).
Dunson, D.L., "Synthesis and Characterization of Thermosetting Polyimide Oligomers for Microelectronics Packaging" (Dissertation submitted to the faculty of the Virginia Polytechnic Institute and State University) (Apr. 21, 2000).
Edmondson, K.M. et al., "Flexible III-V Multijunction Solar Blanket," *Photovoltaic Energy Conversion, Conference Record of the 2006 IEEE 4th World Conference*, pp. 1935-1938 (May 2006).
Herriage, M.J. et al., "EOS AM-1 GaAs/Ge Flexible Blanket Solar Array," *IEEE* (1996).
Pellegrino, S., "Large Retractable Appendages in Spacecraft," *Journal of Spacecraft and Rockets*, vol. 32, No. 6.(Nov.-Dec. 1995).
White, S. et al., "Ultraflex-175 On Space Technology 8 (ST8)—Validating the Next-Generation in Lightweight Solar Arrays," Proceedings of NASA Science and Technology Conference, University of Maryland (Jun. 19-21, 2007).

* cited by examiner

*Primary Examiner* — Kevin Parendo
(74) *Attorney, Agent, or Firm* — Diane M. Tsuda

(57) ABSTRACT

A method of constructing a solar cell panel is disclosed that includes providing a solar cell that has a front side and a back side, where the front side faces the sun during normal operation, heating a thermoplastic polyimide to at least its reflow temperature, flowing the thermoplastic polyimide onto the back side of the solar cell while heated to at least its reflow temperature, and cooling the thermoplastic polyimide to a temperature below its reflow temperature to bond the thermoplastic polyimide directly to the solar cell. The direct bonding of the thermoplastic polyimide to the solar cell is accomplished without an adhesive such as RTV adhesives. The method may also include bonding a substrate directly to the thermoplastic polyimide opposite the solar cell.

26 Claims, 5 Drawing Sheets

BONDING SOLAR CELLS DIRECTLY TO POLYIMIDE

FIELD

This application relates to solar cells and, more particularly, to methods of bonding a thermoplastic polyimide directly to a solar cell.

BACKGROUND

As shown in FIG. 1, a spacecraft 10 includes a number of rigid solar panels 12, which are shown in their deployed position. Solar arrays 14 which may include hundreds or thousands of solar cells 16 bonded to each solar panel 12 are used to provide electrical power to drive a variety of spacecraft systems and to recharge its batteries. The spacecraft rotates the solar panels 12 so that they receive direct illumination from the sun 18 to increase efficiency.

The solar cells 16 include a flat photovoltaic wafer made from n-type or p-type crystalline semiconductor material, such as silicon, gallium-arsenide or germanium in or on which a thin surface layer of the opposite conductivity type is formed. The interface between the surface layer and the main region of the wafer defines a semiconductor junction. Illumination of the thin surface layer causes liberation of charge carriers, including electrons and holes in the region of the semiconductor junction, which migrate toward opposite surfaces to establish a potential across the solar cell.

The solar panel 12 has three primary functions. First, the panel provides a rigid support structure with sufficient axial and bending stiffness for carrying the solar cell array 14 through a dynamically active launch environment into orbit and positioning it to receive illumination. Secondly, the front surface of the solar panel 12 to which the cells are bonded is electrically inert so that the individual solar cells 16 are electrically isolated. Lastly, the solar panel 12 serves as a heat sink to the space facing side (opposite sun 18) for the solar cell array. The spacecraft 10 of FIG. 1 is a rigid array as described. Thin film solar arrays are also possible that utilize a different stowed structure during launch that is lighter and more load efficient than the rigid panels, which might include a gossamer deployment structure that holds the solar cells out in space on the thin film solar array.

There are a number of important issues associated with solar panel design regardless of being a rigid array, a thin film array, or a flexible array. The heat sink capabilities of the substrate must be sufficient to cool the solar cell array to maintain power efficiency. The solar panel should have low and/or matched thermal expansion properties compared to the solar cells. The temperature on the illuminated side of the array can be as high as +70° C. and can be as low as −180° C. or lower for thin film arrays on the back surface, which faces deep space. Due to these thermal expansion properties, warping or damage of the solar panel can occur.

A paramount concern in solar panel design is weight. Existing spacecraft can have eight solar panels, four per side, where the structural constituents weigh approximately 10 lbs (4.5 kg) per panel. Currently, the cost of flying a spacecraft can be estimated as high as $25,000 or more per pound over the lifetime of the spacecraft. Hence, the weight of the solar panel impacts the overall cost of operating a spacecraft.

Solar cells are often supported by a graphite facesheet and an insulating layer facesheet that are bonded to the solar cell by a silicone-based adhesive called "RTV" adhesive. The cross-section of such solar cells, from top to bottom, typically include a solar cell CIC (coverglass, interconnects, cell), a layer of the RTV adhesive, an insulative layer facesheet (e.g., a DuPont™ Tedlar® polyvinyl fluoride (PVF) film or a polyimide such as a Dupont™ Kapton® polyimide film), and a graphite or Kevlar® facesheet on a honeycomb substrate. The RTV is acknowledged in the industry as a source of degradation over the life of the solar arrays. Attempts to reduce the degradation of the solar arrays include the development of ultra low outgassing RTVs.

RTVs have a coefficient of thermal expansion ("CTE") in the range of 100-200 ppm/° C. A Kapton® polyimide film has a CTE around 17-20 ppm/° C. and some solar cells have CTEs around 3-8 ppm/° C. The mismatch in the CTEs between the solar cell, RTV adhesive, and Kapton® polyimide film is inherent in using this accepted adhesive as the standard adhesive for constructing solar arrays. One way to combat this mismatch has been to optimize the thickness of the RTV. But, increasing the thickness adds weight to the solar array, which depending upon the application intended for the solar array may be undesirable.

SUMMARY

In one aspect, methods are disclosed that include constructing a solar cell panel by providing a solar cell that has a front side and a back side (the front side faces the sun during normal operation), heating a thermoplastic polyimide to at least its reflow temperature, flowing the thermoplastic polyimide onto the back side of the solar cell while heated to at least its reflow temperature, and cooling the thermoplastic polyimide to a temperature below its reflow temperature to bond the thermoplastic polyimide directly to the solar cell. The direct bonding of the thermoplastic polyimide to the solar cell is accomplished without an adhesive such as RTV adhesives. The methods may be used on thin film folded or flexible solar arrays, therefore the same benefits would be provided to rigid and flexible solar arrays. In particular, the elimination of the RTV adhesives reduces the overall weight of the solar arrays and reduces the disparity in CTE values for adjacent layers, which ultimately reduces the thermal stresses during thermal cycles of the solar arrays and provides for an increased life span of the arrays.

The methods may also include bonding a substrate directly to the thermoplastic polyimide opposite the solar cell. This bonding step may occur subsequent to the flowing and cooling of the thermoplastic polyimide.

In another aspect, methods of constructing a modular solar cell array are disclosed that include providing a plurality of solar cells having a front side and a back side, (where the front faces the sun during normal operation), heating a thermoplastic polyimide to at least its reflow temperature, flowing the thermoplastic polyimide onto the back side of the plurality of solar cells while heated to at least its reflow temperature, cooling the thermoplastic polyimide to a temperature below its reflow temperature to bond the thermoplastic polyimide directly to the plurality of solar cells, and electrically connecting the plurality of solar cells to at least one other solar cell within the array.

In one embodiment, a plurality of the solar cells provided each include a harness electrically connected to the solar cell. In another embodiment, the methods include bonding a substrate to the thermoplastic polyimide opposite the back side of the solar cell.

The features, functions, and advantages that have been discussed can be achieved independently in various embodiments or may be combined in yet other embodiments, further details of which can be seen with reference to the following drawings and description.

DESCRIPTION

Figure 1:
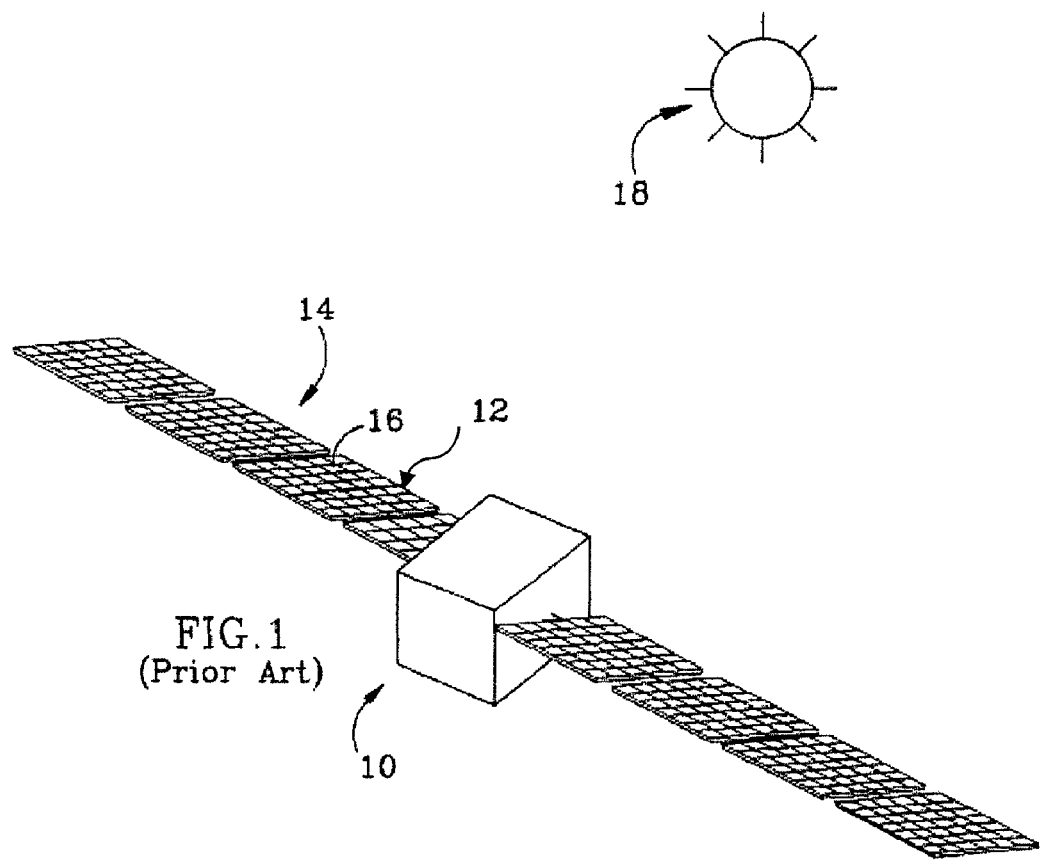
FIG. 1 is a perspective view of a spacecraft with solar panels in a deployed position.

The following detailed description will illustrate the general principles of the invention, examples of which are additionally illustrated in the accompanying drawings. In the drawings, like reference numbers indicate identical or functionally similar elements.

Figure 2:
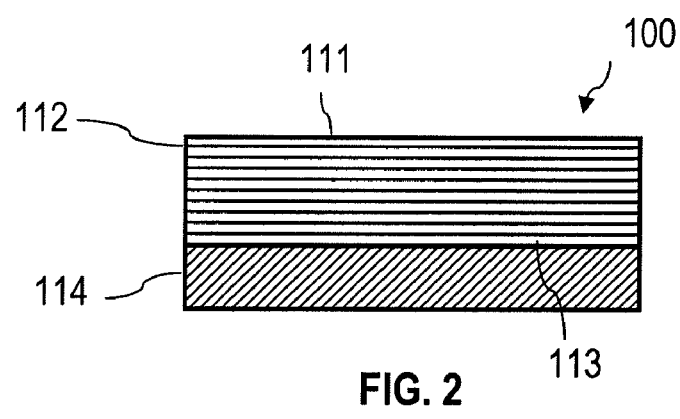
FIG. 2 is a cross-sectional illustration of one embodiment of a solar cell panel having a solar cell directly laminated to a thermoplastic polyimide.

Referring to FIG. 2, an embodiment of a solar cell panel, generally designated 100, is illustrated in cross-section. The solar cell panel 100 includes a solar cell 112 having a front side 111 and a back side 113 with a thermoplastic polyimide 114 directly bonded to the back side 113 of the solar cell 112 (without an adhesive). In normal operation, the front side 111 of the solar cell 112 faces the sun and the thermoplastic polyimide 114 acts as an insulating layer within the solar cell panel 100. As shown in FIG. 2, solar cell panel 100 does not include a substrate or facesheet beneath the polyimide. In this embodiment, panel 100 is suitable for inclusion in a flexible array.

Figure 3:
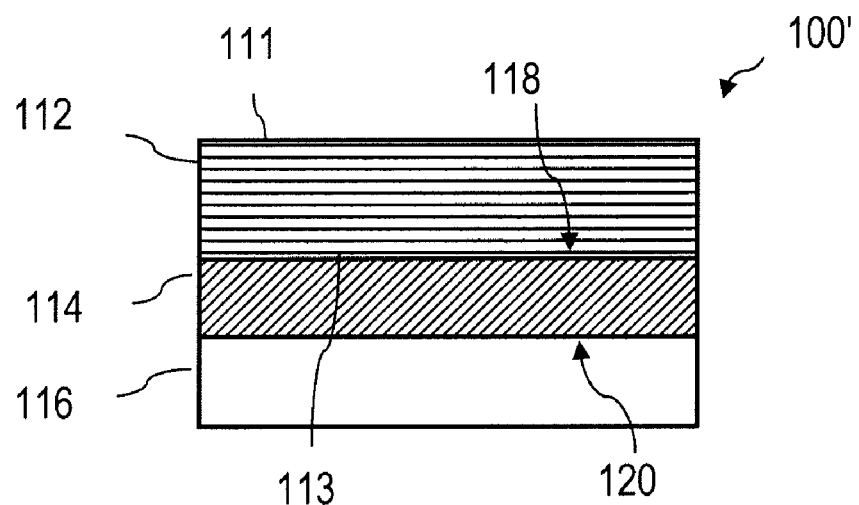
FIG. 3 is a cross-sectional illustration of one embodiment of a solar cell panel having a solar cell directly laminated to a support structure by a thermoplastic polyimide.

In another embodiment, panel 100 may include a substrate as shown in FIG. 3 and be suitable for inclusion in a rigid array. Referring to FIG. 3, a solar cell panel, designated 100' and illustrated in cross-section, is shown that has a solar cell 112 with a thermoplastic polyimide 114 directly bonded to the back side 113 and that has a substrate 116 directly bonded to the thermoplastic polyimide 114 opposite the solar cell 112. The thermoplastic polyimide 114 has a first major surface 118 and a second major surface 120 with the first major surface 118 laminated to the solar cell 112 and the second major surface 120 laminated to the substrate 116. Similarly to FIG. 2, no adhesives are used between any of the layers of solar cell panel 100'. Instead, the thermoplastic polyimide 114 acts as an insulating layer and as an adherent to bond the components of the solar cell panel 100' together.

The elimination of the adhesive between the solar cell 112 and the polyimide 114 and between the polyimide 114 and the substrate 116, if present, reduces the mass of the solar panel and reduces its manufacturing cycle, which can provide higher production volume with lower production costs. The elimination of the adhesive may reduce the overall mass of a rigid solar array by about 6-10% and the mass of a flexible array by about 33-38%. Eliminating the RTV adhesives also improves the solar array by providing adjacent layers (the solar cell and the polyimide) that have CTEs that are more closely aligned (i.e., that have less disparity between them). Having the polyimide directly bonded to the solar cell decreases fatigue during thermal cycling, increases thermal and power efficiency of the solar panel, and enables multiple terrestrial, aeronautical, and aerospace applications. A further benefit of bonding the solar cell 112 directly to the polyimide 114 is a more direct thermal path for the solar cell 112, which reduces the temperature of the solar cell 112 and inversely increases the efficiency thereof.

The solar cell 112 of FIGS. 2 and 3 may be any type of solar cell. In one embodiment, the solar cell 112 has a backside 113 that includes a metal or ceramic (i.e. silicon (Si), germanium (Ge), gallium arsenide (GaAs)). The metal or ceramic may cover the entire backside 113 of the solar cell 112 for more uniform bonding to the polyimide layer 114. In another embodiment, the metal or ceramic may covers only part of the backside 113. The metal may include, but is not limited to, silver, gold, and/or zinc. "Metal" as used herein includes metals or metal alloys or compounds or composites including at least one metal or metal alloy.

The type of solar cell 112 that the polyimide is directly bonded to is generally not limited. Suitable solar cells include advanced triple junction solar cells, single-junction or multi-junction or multicrystalline silicon solar cells, dual junction solar cells, inverted metamorphic (IMM) solar cells, amorphous silicon solar cells, organic or inorganic solar cells, CIGS solar cells, single junction GaAs solar cell, and CdTe solar cells, and hereinafter developed solar cells.

In one embodiment, the solar cells may have a CTE of about 3 to 8 ppm/C depending on the temperature.

The polyimide 114 may be any thermoplastic polyimide. In one embodiment, the thermoplastic polyimide has a CTE that substantially matches the CTE of the solar cell. Substantially matched CTEs provide a superior solar cell panel that has improved longevity because it will experience less fatigue during thermal cycling. To be substantially matched the CTE of the polyimide may be ±about 1%-5% of the CTE value of the solar cell. For example, if the solar cell has a CTE of 8 ppm/° C., then the CTE of the polyimide is 8 ppm/° C.±0.08-0.4 ppm/° C.

The thermoplastic polyimide may have a CTE of about 3 to 8 ppm/° C. In one embodiment, the solar cell has a CTE of about 3 ppm/° C. and the thermoplastic polyimide has a CTE of about 3 ppm/° C. In another embodiment, the solar cell has a CTE of about 4 ppm/° C. and the thermoplastic polyimide has a CTE of about 4 ppm/° C. In another embodiment, the solar cell has a CTE of about 5 ppm/° C. and the thermoplastic polyimide has a CTE of about 5 ppm/° C. In another embodiment, the solar cell has a CTE of about 6 ppm/° C. and the thermoplastic polyimide has a CTE of about 6 ppm/° C. In another embodiment, the solar cell has a CTE of about 7 ppm/° C. and the thermoplastic polyimide has a CTE of about 7 ppm/° C. In another embodiment, the solar cell has a CTE of about 8 ppm/° C. and the thermoplastic polyimide has a CTE of about 8 ppm/° C.

The thermoplastic polyimides may also be characterized as being reflowable and have a reflow temperature of about 300° C. or greater, but below a temperature that would liquefy or decompose the thermoplastic polyimide and/or a temperature that would damage the selected solar cell (typically greater than 400° C.). In one embodiment, the reflow temperature of the thermoplastic polyimide is at or between about 300° C. to about 375° C. In another embodiment, the reflow temperature of the thermoplastic polyimide is at or between about 315° C. to about 350° C. A reflowable thermoplastic polyimide allows flexibility in the design of solar panels and solar arrays because the thermoplastic polyimide can be flowed to and/or over irregular shapes. It also enables fabrication of layers of uniform or non-uniform thickness.

The thermoplastic polyimides may also be characterized as being insulative. Suitable insulative thermoplastic polyimides for solar panel applications may have a dielectric strength of about or greater than 1000 V/mil. In one embodiment, the insulative thermoplastic polyimides may have a dielectric strength of about or greater than 1800 V/mil or 2000 V/mil.

Once bonded to the solar cell, the thermoplastic polyimide may be present as a layer having a thickness of about ½ mil (0.0005 in) to about 10 mil (0.01 in). In one embodiment, the thickness of the thermoplastic polyimide layer may be about 1 mil (0.001 in) to about 2 mil (0.002 in).

In one embodiment, the thermoplastic polyimide may be a Novastrat® polyimide available from ManTech SRS Technologies, Inc. of Huntsville, Ala. The Novastrat® polyimide product line provides polyimides with adjustable CTEs. The Novastrat® polyimide may be adjusted to exhibit CTEs between −16 ppm/° C. and 53 ppm/° C., including 0 ppm/° C., 10 ppm/° C., 17 ppm/° C., and 25 ppm/° C. corresponding with CTE matches of graphite/epoxy, carbon steel, copper, and aluminum (respectively). The thermoplastic polyimides may be a polyimide composition comprising a combination of diamine and tertracarboxylic acid (such as but not limited to a dianhydride) components that are specifically engineered to have a desired property, such as a CTE. In one embodiment, the polyimide composition comprises at least one diamine monomer and at least two dianhydride monomer types, said polyimide composition engineered to have a desired property by varying the molar ratio of the at least two dianhydride components with respect to one another. In an alternate embodiment, the polyimide composition comprises at least two diamine monomer types and at least one dianhydride monomer, said polyimide composition engineered to have a desired property by varying the molar ratio of the at least two diamine components with respect to one another. In yet another embodiment, the polyimide composition comprises at least two diamine monomer types and at least two dianhydride monomer types, said polyimide composition engineered to have a desired property by varying the molar ratio of the at least two dianhydride components with respect to one another, by varying the molar ratio of the at least two diamine components with respect to one another or by varying the molar ratio of the at least two dianhydride components with respect to one another and varying the molar ratio of the at least two diamine components with respect to one another.

The diamine and dianhydride components may be any diamine or dianhydride components that are known in the art. In one embodiment, the diamine monomers are 2,2-bis[4-(4aminophenoxy)phenyl]-hexafluoropropane (BDAF) or 4,4'-diaminobenzanilide (DABA) or combinations of the foregoing and the dianhydride monomers are 4,4'-(hexafluoroisopropylidene)di-phthalicanhydride (6-FDA) and 3,3',4,4'-biphenyltetracarboxylic acid dianhydride (s-BPDA) or combinations of the foregoing. In one embodiment, increasing the mole percentage of BDAF in a polyimide composition comprising DABA (89 to 50 mole %) and s-BPDA as the dianhydride (100 mole %) increases the CTE value (determined at 25 to 200° C.) of the polyimide composition from −15.1 ppm/K (11 mole % BDAF) to 26.6 ppm/K (50 mole % BDAF). In another embodiment, increasing the mole percentage of 6-FDA in a polyimide composition comprising DABA (100 mole %) and s-BPDA (89 and 55 mole %) increases the CTE value (determined at 25 to 200° C.) of the polyimide composition from −16.5 ppm/K (11 mole % 6-FDA) to 12.3 ppm/K (45 mole % 6-FDA). In another embodiment, increasing the mole percentage of 6-FDA in a polyimide composition comprising DABA (67 mole %), BDAF (33 mole %) and s-BPDA (11 to 33 mole %) increases the CTE value (determined at 25 to 200° C.) of the polyimide composition from 15.6 ppm/K (11 mole % 6-FDA) to 31.8 ppm/K (33 mole % 6-FDA). In yet another embodiment, increasing the mole percentage of BDAF in a polyimide composition comprising DABA (100 and 67 mole %), s-BPDA (89 mole %) and 6-FDA (89 mole %) increases the CTE value (determined at 25 to 200° C.) of the polyimide composition from −16.5 ppm/K (0 mole % BDAF) to 15.6 ppm/K (33 mole % 6-FDA).

The polyimide compositions may be prepared as is generally known in the art (for example, see U.S. Pat. Nos. 3,179,630 and 3,179,634, "Polyimides-Thermally Stable Polymers", Plenum Publishing (1987), "Synthesis and Characterization of Thermosetting polyimide Oligomers for Microelectronics Packaging, Dunson D. L., (Dissertation submitted to faculty of the Virginia Polytechnic Institute and State University, Apr. 21, 2000) and as described in as described in U.S. Published Patent Application No. 2008/0214777 to Poe (assigned to SRS Technologies).

The thermoplastic polyimides may be a bulk source that is heated to its reflow temperature and poured over the solar cells to form a polyimide layer. Alternately, the thermoplastic polyimides may be a polyimide sheet that may be laid onto the solar cells and heated to a reflow temperature such that the polyimides flows onto and/or over the solar cells. The "sheet" may come in many different forms, for example but not limited thereto, a mesh or scrim, strips, or a film having a uniform or non-uniform major surface. The thermoplastic polyimide sheet may be "B-stage" cured such that the polyimide is handleable as a sheet, but is still reflowable once heated to the reflow temperature of the particular polyimide.

Substrate 116 may be any suitable material and hereinafter developed material for aerospace, aeronautical, and/or terrestrial applications. Depending upon the application, the properties of the substrate may vary. In aerospace applications, for example, a suitable substrate may be a one that provides high stiffness and is light weight. When the substrate 116 is present and provides stiffness, a rigid solar array may be formed using a plurality of solar cell panels, such as solar cell panel 110'. In aeronautical applications, a suitable substrate may be any material suitable for the skin of an aircraft or other aeronautical apparatus or device. In terrestrial applications, a suitable substrate may be one that draws heat away from the solar cells. The substrate may also provides a solid surface for mounting the solar cell-polyimide composite thereto and/or into a solar array.

The substrate 116 may be or include graphite, aramid-based materials, carbon fiber materials, metal or metal alloys, and/or other materials, including composites containing one or more of these materials. In one embodiment where the solar cell panel is for an aerospace application, the substrate may be or include graphite and/or aramid-based materials. In one embodiment where the solar cell panel is for an aeronautical application, the substrate may be or include graphite, aramid-based, carbon fiber and/or aluminum metal or metal ally materials. In another embodiment for an aeronautical application, the substrate may be or include a composite material, for example, a carbon fiber/epoxy composite or a ceramic composite. In one embodiment where the solar cell panel is for a terrestrial application, the substrate may be or include copper and/or aluminum metals or metal alloys.

Figure 4:
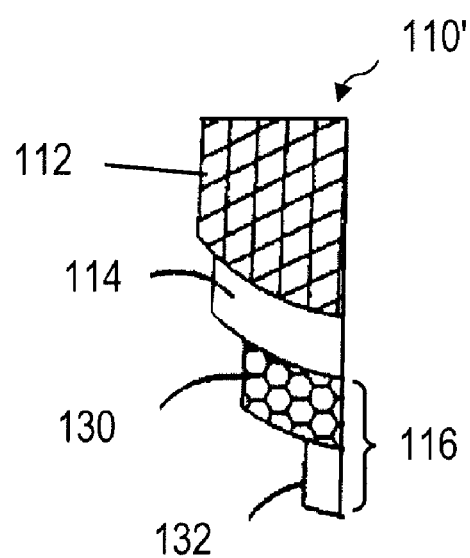
FIG. 4 is a perspective and exploded view of rigid solar cell panel of FIG. 3

In another embodiment, as shown in FIG. 4, a solar panel 110' includes the polyimide 114 bonded to a substrate 116, which may be a honeycomb composite substrate. The honeycomb composite substrate 116 may include a facesheet 132 and a honeycomb core 130 that are co-cured, laminated, or directly bonded to the polyimide layer 114. In one embodiment, a graphite or an aramid-based material is the facesheet 132 of the honeycomb composite substrate 116. The honeycomb core 130 functions as a heat sink and stiffener structure. As used herein the term honeycomb refers to any non-solid pattern. The preferred pattern has hexagonal, i.e. "honeycomb", shaped cells. Alternately, the pattern could be squares or some other geometric shape. The core is preferably formed from a light weight, high thermally conductive material such as aluminum.

Figure 5:
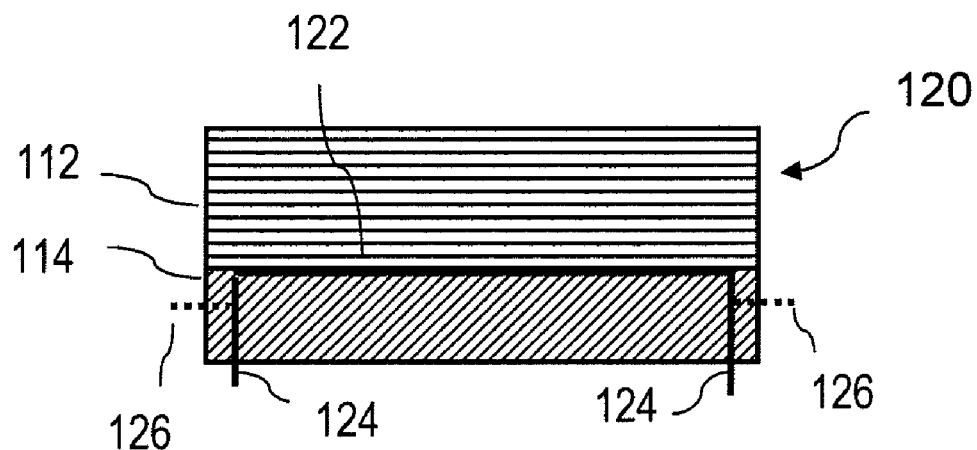
FIG. 5 is a cross-sectional illustration of one embodiment of a solar cell panel having a harness embedded in the thermoplastic polyimide.
Figure 6:
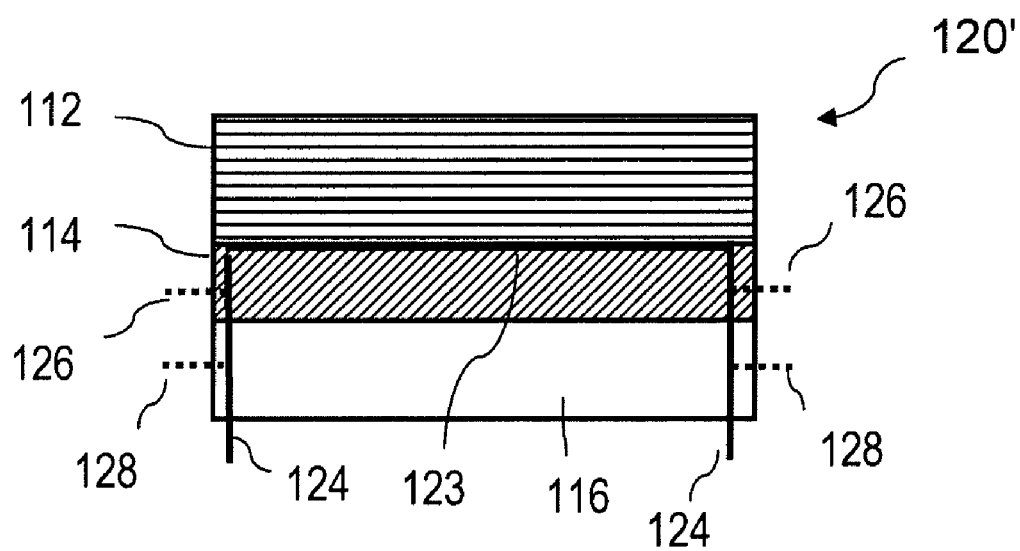
FIG. 6 is a cross-sectional illustration of another embodiment of a solar cell panel having a harness embedded in the thermoplastic polyimide.

Now turning to FIGS. 5-6, the solar cells 112 may be interconnected to at least one other solar cell by traditional interconnections. In addition or as an alternative to the solar cell interconnections, the solar cell panels, generally designated 120 and 120' in FIGS. 5-6 may include at least one embedded harness 122, 123, respectively, for interconnecting the solar cells and/or solar cell panels to one another. Solar cell panel 120 (FIG. 5) is similar to solar cell panel 100 of FIG. 2 except that a harness 122 is included. The harness 122 is embedded in the polyimide layer 114 such that the harness is in electrical contact with the solar cell 112. The harness 122 may include first leads 124 that extend through the polyimide layer 114 and exit a major surface of the polyimide 114 or the panel 120 opposite the solar cell 112. In another embodiment, second leads 126 may be present that extend out of an edge (left or right side relative to the illustration on the page) of the polyimide layer 114. In another embodiment, the harness 122 may include both the first and second leads 124, 126. While two leads have been illustrated for each of the first leads 124 and the second leads 126, the harness is not limited thereto. One of skill in the art will appreciate that any number of leads may be appropriate for connecting a plurality of solar cells 112 and/or solar panels 120 together.

The harness 122 of FIG. 5 may have any shape or configuration that allows for embedding the harnesses in the thermoplastic polyimide 114 or for flowing the thermoplastic polyimide around the harness 122 and over the solar cell 112. For example, the harness 122 may be in the form of a mesh or scrim that has leads such as leads 124, 126 extending therefrom. The harness 122 may be a flat flexible copper or aluminum harness or other thin wire harness materials/alloys. The material for the harness is preferably selected to be substantially CTE matched to the CTE values of the solar cell and/or the thermoplastic polyimide.

Now referring to FIG. 6, solar cell panel 120' is similar to solar cell panel 100' of FIG. 3 having substrate 116, but including harness 123. Similar to harness 122 of FIG. 5, harness 123 in FIG. 6 is embedded in the polyimide layer 114 such that the harness 123 is in electrical contact with the solar cell 112. The harness 123 may include first leads 124 that exit a major surface of the substrate 116 opposite the solar cell 112, second leads 126 that extend out of an edge (left or right side relative to the illustration on the page) of polyimide layer 114, and/or third leads 128 exiting or extending out of an edge of the substrate 116. The position of the leads 124, 126, and 128 are not limited and may be anywhere along the edge of polyimide 114 for leads 126, 128 and anywhere along the major surface of the substrate 116 for leads 124. While two leads have been illustrated for each of first leads 124, second leads 126, and third leads of harness 123, the harness is not limited thereto. One of skill in the art will appreciate that any number of leads may be appropriate for connecting a plurality of solar cells 112 and/or solar cell panel 120' together.

Similarly to harness 122, harness 123 may have any shape or configuration that allows for embedding the harnesses in the thermoplastic polyimide 114 or for flowing the thermoplastic polyimide around the harness 123 and over the solar cell 112. For example, the harness 123 may be in the form of a mesh or scrim that has leads such as leads 124, 126 extending therefrom. The harness 123 may be a flat flexible copper or aluminum harness or other thin wire harness materials/alloys.

In the present invention, to make repairs easier and to minimize cost, the solar cell panels may be formed in modular units having from one solar cell to about 20 solar cells bonded together by the thermoplastic polyimide. In one embodiment, the modular unit includes one to eight solar cells. Accordingly, the modular unit may include eight solar cells, seven solar cells, six solar cells, five solar cells, four solar cells, three solar cells, two solar cells, or one solar cell. In an array having hundreds of solar cells, when one modular unit is damaged or defective it may be replaced. The harnesses described above can provide connectability for the modular units that also contributes to the replaceability thereof.

Figure 7:
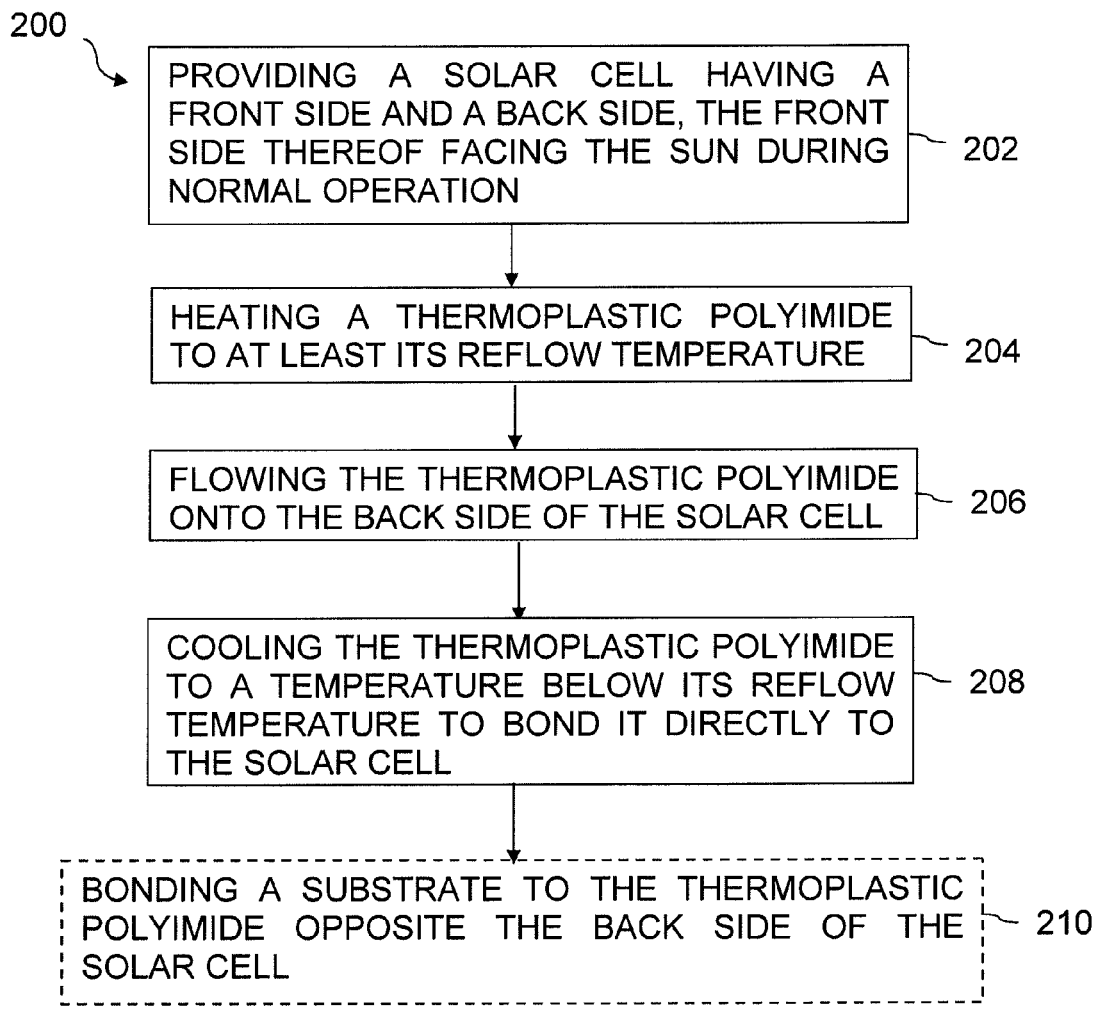
FIG. 7 is a flow chart of one embodiment of a method disclosed herein.

Referring now to FIG. 7, a flow chart is shown that depicts a method 200 of constructing solar cell panels having the following steps: step 202—providing a solar cell that has a front side and a back side where the front side faces the sun during normal operation; step 204—heating a thermoplastic polyimide to at least its reflow temperature; step 206—flowing the thermoplastic polyimide onto the back side of the solar cell; step 208—cooling the thermoplastic polyimide to a temperature below its reflow temperature to bond the thermoplastic polyimide directly to the solar cell. The solar cell provided may be any type of solar cell, as described above.

Step 204 may include heating the thermoplastic polyimide to a reflow temperature of greater than about 300° C., but below a temperature that would liquefy or decompose the thermoplastic polyimide and/or a temperature that would damage the selected solar cell. As such, the temperatures may vary depending upon the melting, or reflow, temperature of the thermoplastic being used. For example, appropriate thermoplastics may have melting points ranging from about 100° C. to about 400° C., and the temperature for the heating step may vary from about 100° C. to about 400° C. In one embodiment, the reflow temperature of the thermoplastic polyimide is at or between about 300° C. to about 375° C. Accordingly, step 204 includes heating to a temperature at or between about 300° C. to about 375° C. In another embodiment, the reflow temperature of the thermoplastic polyimide is at or between about 315° C. to about 350° C. In addition, the thermoplastic should have a reflow temperature above temperatures at which the solar cell panel may be subsequently processed and/or used. In this manner, the thermoplastic may not reflow subsequent to attachment.

It is understood that the heating step 204 may be performed in or by any suitable apparatus or mechanisms for controlling the heat applied to the thermoplastic polyimide. In one embodiment, the heating step may be performed by an oven, microwave or other forms of radiation, a hot water bath, or other apparatus or methods. The application of pressure is generally not necessary for the steps of method 200 and as such the steps may be performed at ambient pressure. If changing or controlling the pressure is desired, it may be applied by any suitable means.

The step 206 of flowing the thermoplastic polyimide may be by any known or herein after developed mechanism or method. In one embodiment, a solar cell, plurality of solar cells, and/or sheet of solar cells may be placed on a casting table (optionally treated with a release agent) with the back side of the solar cells facing up and the thermoplastic polyimide after being heated to a reflow temperature may be poured or flowed over the solar cells. The thermoplastic polyimide is then cooled to ambient temperature. Thereafter, the solar panel(s) may be removed from the casting table. In another embodiment, the solar cell, plurality of solar cells, and/or sheet of solar cells may be suspended or transported for continuous or discontinuous application of the flowable thermoplastic polyimide using known or herein after developed coating techniques. After coating the solar cell(s) with the flowable thermoplastic polyimide, the polyimide is allowed to cool to ambient temperature.

As a result of carrying out steps 202 to 208, a solar cell panel having a cross section similar to that depicted in FIG. 2 is formed. These solar cell panels may be included in a flexible array of solar panels.

If a rigid array is desired, the method 200 may include the optional step 210 of bonding a substrate to thermoplastic polyimide opposite the back side of the solar cell. Step 210 may be performed subsequent to the bonding of the thermoplastic polyimide to the solar cell (steps 204 through 206) or contemporaneously therewith. If bonded subsequently, step 210 may include the application of heat and pressure to bond the substrate to the thermoplastic polyimide. It is understood that the bonding step 210 may be performed in or by any suitable apparatus or mechanisms, including but not limited to an autoclave or other similar apparatus for controlling the heat and pressure applied to the solar cell and polyimide. In one embodiment, the heating step may be performed by an oven, a hot water bath, microwaves or other forms of radiation, or other apparatus or methods. If the substrate is bonded contemporaneously with the solar cell, the substrate may be placed on the thermoplastic polyimide prior to the cooling step 208, preferably after the flowing step 206.

Still referring to FIG. 7, the solar cell provided in step 202 may include a harness electrically connected to the solar cell, typically to the back side of the solar cell. Thus, the method may include a step of electrically connecting the harness to the solar cell. The harness is preferably electrically connected to the solar cell before flowing the thermoplastic polyimide thereover. The harness is characterized as being connectable to another solar cell, solar cell panel, or harness.

Suitable solar cells, thermoplastic polyimides, substrates, and harnesses for use in the method 200 are discussed above with respect to FIGS. 2-6.

Figure 8:
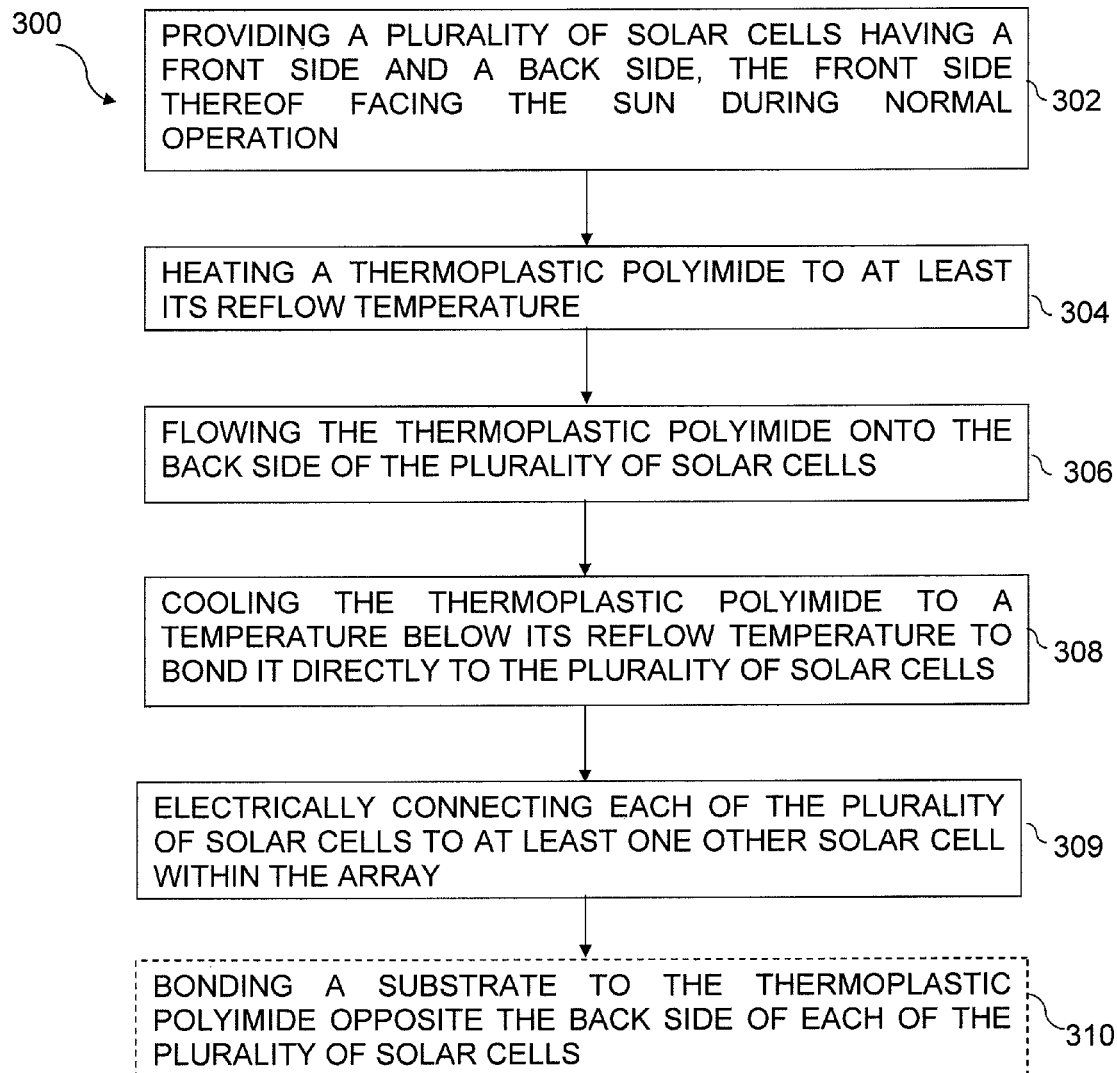
FIG. 8 is a flow chart of another embodiment of a method disclosed herein.

Referring now to FIG. 8, a flow chart is shown that depicts a method 300 of constructing a modular solar cell array having the following steps: step 302—providing a plurality of solar cells that each have a front side and a back side where the front side faces the sun during normal operation; step 304—heating a thermoplastic polyimide to at least its reflow temperature; step 306—flowing the thermoplastic polyimide onto the back sides of the plurality of solar cells; step 308—cooling the thermoplastic polyimide to a temperature below its reflow temperature to bond the thermoplastic polyimide directly to the plurality of solar cells; and step 309—electrically connecting the plurality of solar cells to at least one other solar cell within the array.

The solar cells provided may be any suitable solar cell 112 as described above. In one embodiment, each solar cell 112 may include a harness 120 or 120' electrically connected thereto. Typically, the harness 120, 120' is electrically connected to the back side of the solar cell 112. Thus, the method 300 may include a step of electrically connecting a harness to each of the solar cells. The harness 120, 120' is preferably electrically connected to the solar cell 112 before flowing the thermoplastic polyimide 114 thereover. The harness is characterized as being connectable to another solar cell, solar cell panel, or harness. In one embodiment, as shown in FIGS. 5-6, the harness 120, 120' may be an extension harness that connects a solar cell panel 100 or 100' to at least one other solar cell panel 100 or 100'. A separate connection may be provided for solar cell 112 to solar cell 112 interconnection. The harness 120, 120' may carry power back to the platform upon which the panels are mounted such as a spacecraft, aircraft, or terrestrial structure. In another embodiment, the harness 120, 120' may provide both the solar cell 112 to solar cell 112 interconnection and the interconnection that interconnects a plurality of solar cell panels to carry power back to the platform upon which the panels are mounted.

The heating step 304, the flowing step 306, and the cooling step 308 may be similar to steps 204 through 208 described above for method 200.

Still referring to FIG. 8, method 300 also includes step 309 where the plurality of solar cells are each electrically connected to at least one other solar cell within the array. Step 309 may include any method of electrically connecting the leads of the harness, described above with respect to FIGS. 5 and 6, to a harness of another solar cell panel or directly to another solar cell or solar cell panel. In one embodiment, step 309 may include soldering the leads together or to another solar cell or solar cell panel. In another embodiment, step 309 may include twisting the leads of two or more solar cell panels together using a wire cap. In another embodiment, step 309 may include plugging a lead from a harness of a first solar cell panel into a receptacle on another harness or a second solar cell panel.

Method 300 may also include an optional step, step 310, similar to step 210 of FIG. 7, of bonding a substrate to a face of the multilayer polyimide such as the face opposite the solar cell. Similarly to method 200, the bonding of the substrate may occur subsequent to the bonding of the solar cell to the thermoplastic polyimide or contemporaneously therewith.

The application of pressure is generally not necessary for the steps of method 300 and as such the steps may be performed at ambient pressure. If changing or controlling the pressure is desired, it may be applied by any suitable means. In one embodiment, the substrate includes a composite matrix and pressure may be applied during the flowing step 306 to ensure that the thermoplastic polyimide flows into any voids present on/in the composite matrix.

Suitable solar cells, thermoplastic polyimides, substrates, and harnesses for use in the method 300 are discussed above with respect to FIGS. 2-6.

The embodiments of this invention described in detail and by reference to specific exemplary embodiments of the solar cell panels and methods are within the scope of the appended claims. It is contemplated that numerous other modifications and variations of the solar cell panels and methods may be created taking advantage of the disclosed approach. In short, it is the applicants' intention that the scope of the patent issuing herefrom be limited only by the scope of the appended claims.

What is claimed is:

1. A method of constructing a solar cell panel, the method comprising:
   providing a solar cell having a front side and a back side, the front side of the solar cell facing the sun during normal operation;
   heating a thermoplastic polyimide to at least its reflow temperature;

flowing the thermoplastic polyimide onto the back side of the solar cell while heated to at least its reflow temperature;

cooling the thermoplastic polyimide to a temperature below its reflow temperature to bond the thermoplastic polyimide directly to the solar cell; and bonding a substrate comprising graphite, aramid-based material, carbon fibers, or combinations thereof directly to the thermoplastic polyimide, without an adhesive, opposite the back side of the solar cell to form a composite;

wherein the thermoplastic polyimide comprises:
at least one diamine monomer and at least two dianhydride monomers, at least two diamine monomers and at least one dianhydride monomer, or at least two diamine monomers and two dianhydride monomers, wherein the diamine monomers are selected from 2,2-bis[4-(4aminophenoxy)phenyl]-hexafluoropropane and 4,4'-diaminobenzanilide and the dianhydride monomers are selected from 4-4'-(hexafluoroisopropylidene)di-phthalicanhydride and 3,3',4,4'-biphenyltetracarboxylic acid dianhydride.

2. The method of claim 1 wherein the thermoplastic polyimide has a coefficient of thermal expansion that substantially matches a coefficient of thermal expansion of the solar cell.

3. The method of claim 2 wherein the coefficient of thermal expansion of the solar cell is about 3 to 8 ppm/° C.

4. The method of claim 1 wherein the reflow temperature is greater than about 300° C. and less than about 400° C.

5. The method of claim 1 wherein heating includes heating the thermoplastic polyimide to about 300° C. to about 375° C.

6. The method of claim 1 wherein the cooling of the thermoplastic polyimide includes cooling to an ambient temperature.

7. The method of claim 1 further comprising providing the thermoplastic polyimide as a polyimide sheet, and placing the polyimide sheet on the solar cell before heating, flowing, and cooling the thermoplastic polyimide.

8. The method of claim 7 further comprising:
placing the substrate on the thermoplastic polyimide prior to cooling the thermoplastic polyimide.

9. The method of claim 1 wherein bonding the substrate to the thermoplastic polyimide includes applying heat and pressure to the composite after the cooling step.

10. The method of claim 1 wherein the substrate is a composite material.

11. The method of claim 10 wherein the substrate comprises a honeycomb composite that includes a graphite facesheet or an aramid-based facesheet.

12. The method of claim 1 wherein the back side of the solar cell includes a metal or ceramic.

13. The method of claim 1 further comprising electrically connecting a harness to the back side of the solar cell before flowing the thermoplastic polyimide, the harness being connectable to another solar cell, solar cell panel, or harness.

14. A method of constructing a modular solar cell array, the method comprising:
providing solar cells each having a front side and a back side, the front side of the solar cells facing the sun during normal operation;
heating a thermoplastic polyimide to at least its reflow temperature;
flowing the thermoplastic polyimide onto the back side of the solar cells while heated to at least its reflow temperature;
cooling the thermoplastic polyimide to a temperature below its reflow temperature to bond the thermoplastic polyimide directly to the solar cells;
bonding a substrate comprising graphite, aramid-based material, carbon fibers, or combinations thereof directly to the thermoplastic polyimide, without an adhesive, opposite the back side of the solar cell to form a composite; and
electrically connecting each of the solar cells to at least one other solar cell within the array;
wherein the thermoplastic polyimide comprises:
at least one diamine monomer and at least two dianhydride monomers, at least two diamine monomers and at least one dianhydride monomer, or at least two diamine monomers and two dianhydride monomers, wherein the diamine monomers are selected from 2,2-bis[4-(4aminophenoxy)phenyl]-hexafluoropropane and 4,4'-diaminobenzanilide and the dianhydride monomers are selected from 4-4'-(hexafluoroisopropylidene)di-phthalicanhydride and 3,3',4,4'-biphenyltetracarboxylic acid dianhydride.

15. The method of claim 14 wherein each of the solar cells has a coefficient of thermal expansion that is substantially the same coefficient of thermal expansion as an adjacent solar cell, and the thermoplastic polyimide has a coefficient of thermal expansion that substantially matches the coefficient of thermal expansion of the solar cells.

16. The method of claim 15 wherein the coefficient of thermal expansion of each solar cell is about 3 to 8 ppm/° C.

17. The method of claim 14 wherein the reflow temperature is greater than about 300° C. and less than about 400° C.

18. The method of claim 17 wherein heating includes heating the thermoplastic polyimide to about 300° C. to about 375° C.

19. The method of claim 14 wherein the cooling of the thermoplastic polyimide includes cooling to an ambient temperature.

20. The method of claim 14 further comprising providing the thermoplastic polyimide as a polyimide sheet, and placing the polyimide sheet on the solar cells before heating, flowing, and cooling the thermoplastic polyimide.

21. The method of claim 14 wherein bonding the substrate to the thermoplastic polyimide includes applying heat and pressure to the composite after the cooling step.

22. The method of claim 14 further comprising:
placing the substrate on the thermoplastic polyimide prior to cooling the thermoplastic polyimide.

23. The method of claim 14 wherein the substrate is a composite material.

24. The method of claim 23 wherein the composite material is a honeycomb composite having a graphite facesheet or an aramid-based facesheet.

25. The method of claim 14 wherein the back side of the solar cell includes a metal or ceramic.

26. The method of claim 14 further comprising electrically connecting a harness to the back side of each of the solar cells before flowing the thermoplastic polyimide, the harnesses being connectable to another solar cell, solar cell panel, or harness.

* * * * *